(12) United States Patent
Solomon et al.

(10) Patent No.: US 8,465,587 B2
(45) Date of Patent: Jun. 18, 2013

(54) MODERN HYDRIDE VAPOR-PHASE EPITAXY SYSTEM AND METHODS

(75) Inventors: Glenn S. Solomon, Redwood City, CA (US); David J. Miller, San Francisco, CA (US)

(73) Assignee: CBL Technologies, Inc., Redwood City, CA (US)

( * ) Notice: Subject to any disclaimer, the term of this patent is extended or adjusted under 35 U.S.C. 154(b) by 840 days.

(21) Appl. No.: 12/649,937

(22) Filed: Dec. 30, 2009

(65) Prior Publication Data
US 2011/0155049 A1  Jun. 30, 2011

(51) Int. Cl.
*C30B 21/02* (2006.01)
(52) U.S. Cl.
USPC ............... 117/86; 117/90; 117/95; 117/100; 117/101; 117/104; 118/716
(58) Field of Classification Search
USPC . 117/86, 90, 95, 100, 101, 104, 952; 118/716
See application file for complete search history.

(56) References Cited

U.S. PATENT DOCUMENTS

| | | | | |
|---|---|---|---|---|
| 6,569,238 B2* | 5/2003 | Ishida | | 117/84 |
| 6,955,719 B2* | 10/2005 | Dmitriev et al. | | 117/91 |
| 7,438,161 B2* | 10/2008 | Burgoon et al. | | 188/73.32 |
| 7,547,359 B2* | 6/2009 | Iwata et al. | | 117/89 |
| 7,794,541 B2* | 9/2010 | Shibata et al. | | 117/84 |
| 7,816,764 B2* | 10/2010 | Marchand et al. | | 257/613 |
| 8,092,597 B2* | 1/2012 | Dmitriev et al. | | 117/99 |

* cited by examiner

*Primary Examiner* — Bob M Kunemund
(74) *Attorney, Agent, or Firm* — Joshua D. Isenberg; JDI Patent

(57) ABSTRACT

Hydride vapor-phase deposition (HVPE) systems are disclosed. An HVPE hydride vapor-phase deposition system may include a reactant source chamber and a growth chamber containing a susceptor coupled to the reactant source chamber. The reactant source chamber may be configured to create a reactant gas through a chemical reaction between a solid or liquid precursor and a different precursor gas. The reactant source chamber can be configured to operate at a temperature T(M) significantly above room temperature. The reactant gas can be chemically unstable at or near room temperature. The susceptor is configured to receive a substrate and maintain the substrate at a substrate temperature T(S). The growth chamber includes walls can be configured to operate at a temperature T(C) such that T(M), T(S) are greater than T(C).

45 Claims, 5 Drawing Sheets

MODERN HYDRIDE VAPOR-PHASE EPITAXY SYSTEM AND METHODS

FIELD OF THE INVENTION

Embodiments of the present invention relate to hydride vapor phase epitaxy and more specifically to a new hydride-vapor phase epitaxy deposition system that overcomes limitations to repeated high-quality deposition of thick epitaxial layers.

BACKGROUND OF THE INVENTION

Hydride vapor-phase epitaxy (HVPE) is an important technique for the epitaxial growth of various semiconductors, such as gallium nitride, an important technological material. For example, GaN is currently used in the manufacture of blue light emitting diodes, semiconductor lasers, and other opto-electronic devices. The background of the related art will be discussed with particular reference to the deposition of GaN, although all of the discussion can be applied to several other compounds such as GaAs.

HVPE is a currently favored technique for GaN buffer layer deposition, because it provides relatively rapid growth in a cost-effective manner. It is also favored in producing thick semiconductor nonlinear optical material, such as GaAs, because of the high growth rates and low background impurity levels. In HVPE, growth of GaN or GaAs proceeds due to the high temperature, vapor-phase reaction between gallium monochloride (GaCl) and either ammonia (NH3) or arsine (AsH3). The ammonia or arsine is supplied from a standard gas source, while the GaCl is produced by passing HCl over a heated liquid gallium supply. The two gases (ammonia and GaCl for GaN) are directed towards a heated substrate where they react to produce solid GaN on the substrate surface.

While HVPE allows for high growth rates of GaN, there are certain difficulties associated with HVPE as a technique that have made it unattractive for industrial applications. First, in current HVPE processes, the metallic source is positioned within the growth chamber in a horizontal configuration. This is done because the GaCl produced in the reaction must be maintained at high temperature (greater than 400° C.) to prevent its decomposition to the low-temperature stable phase of gallium trichloride (GaCl$_3$.) GaCl$_3$ cannot be used for HVPE because the presence of the two extra chlorine atoms pushes the growth reaction towards etching rather than deposition. Prior to this invention, the only practical method for maintaining GaCl temperature was to have the metallic source directly inside the growth chamber, which is always maintained at an elevated temperature for the crystal growth process. A multiple-zone furnace may be used, with a substrate zone and GaCl production zone, with each set to an optimal temperature for the respective process. In all cases however, the GaCl production zone and substrate are contained within the same enclosure. As a result of this, it is necessary to disturb the entire enclosure to service (refill) the metallic source as it becomes depleted with use.

A second limitation to the industrial use of HVPE is the parasitic growth chamber wall deposits. A consequence of the HVPE deposition reaction is that it is thermodynamically more favorable at lower temperatures. To inhibit wall deposits, the reactor environment is maintained in such a manner that the substrate is cooler than the reactor walls. Typically this is accomplished by heating the substrate with a furnace or heater which is external to the growth chamber. Even so, the deposition rate is not nearly as selective as in other industrial growth processes such as organo-metallic vapor-phase epitaxy, and deposition still does occur on the growth chamber walls. Once deposition has nucleated on such surfaces the reaction rates increase leading to a nonuniform and decreasing deposition rate at the substrate. Additionally, wall deposits may flake off or shed particles that are carried downstream to the substrate zone, where they can become incorporated into the growing crystal as second-phase defects.

A third limitation is the mixing of group III and group V reactant compounds such as GaCl and ammonia before the preferred deposition region at the substrate. Because of the reactant chemistry and the near uniform heating throughout the growth chamber the gas species can react before the substrate forming gas-phase borne particulates, which may be incorporated into the crystal growth at the substrate forming second-phase defects in the crystal.

SUMMARY OF THE INVENTION

In view of the above, it is an object of the present invention to provide a new type of HVPE deposition system for the efficient growth of gallium nitride, gallium arsenide, and other compounds. Components of embodiments of the invention allow for the creation of an external reactant source chamber for generating a reactant, such as gallium monochloride or related temperature-sensitive chemically unstable reactants, in a way that provides a uniform flow rate regardless of the amount of material present and which can be reloaded with material without disruption to the growth chamber. Additionally, a new type of growth chamber design allows for the complete elimination of gas phase wall deposits. Additionally, a new flow design keeps reactant gas species separated insuring no gas-phase reactions before the substrate surface region.

Using as an example the case of GaN deposition, HVPE is a result of a reaction on the substrate between a Ga-bearing compound, GaCl, and a nitrogen-bearing source. A typical nitrogen source is ammonia (NH$_3$). The reaction would proceed as follows:

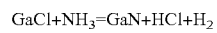

$$GaCl + NH_3 = GaN + HCl + H_2$$

The Ga-bearing precursor compound GaCl is produced in a prior reaction between Ga metal and HCl gas:

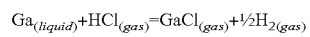

$$Ga_{(liquid)} + HCl_{(gas)} = GaCl_{(gas)} + \tfrac{1}{2}H_{2(gas)}$$

This reaction occurs upstream at 850° C., in a separate reaction zone. At this temperature the reaction produces the high-temperature form of gallium chloride, gallium monochloride (GaCl). At lower temperatures HCl reacts to form gallium trichloride, GaCl$_3$, which is less favorable for deposition due to thermodynamic considerations. GaCl is unstable at lower temperatures, below approximately 400° C., it decomposes into the trichloride variant plus gallium metal:

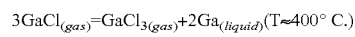

$$3GaCl_{(gas)} = GaCl_{3(gas)} + 2Ga_{(liquid)} (T \approx 400° C.)$$

It is very important that the GaCl remain above 400° C. while it is transported to the substrate to avoid this reaction.

The system incorporates an external reactant source chamber (e.g., a GaCl production cell) coupled to a growth chamber that uses an internal substrate heater. This is a significant conceptual departure from the "traditional" HVPE system design where the reactant source chamber is located inside the growth chamber.

One component of embodiments of the invention is the external reactant source chamber, which can be used, e.g., for metal-hydride/halide generation. Because of the high temperature and corrosive nature of reactants such as chlorine, that are used for metal hydride/halide generation, metal containment cannot be used for a conventional growth chamber and quartz is favored. Any connecting tubing between a GaCl source and substrate must be kept at elevated temperatures and thus all state of the art systems have the metal hydride generation zone inside the growth chamber. However, it has been determined by the applicants that it is best to separate the two regions; the metal hydride reactor zone may be serviced and refilled without opening the growth chamber, and the temperatures of the reactant source chamber and the growth chamber can be maintained independently.

Furthermore, multiple reactant source chambers, e.g., many different hydride reactors containing different source materials, can be attached to the main reactor.

In an embodiment of the invention, the reactor(s) can attach to a squat growth chamber via metal connections. Because the growth chamber reactor is squat the substrate heater insures the region above it is hot, and the distance the metal chloride travels is short and the gas temperature remains sufficiently hot. In another embodiment of the invention, a heater can be used to maintain sufficient temperature in the connecting tube between the reactant source chamber and the growth chamber.

A second component of certain embodiments of the invention is a cold-walled reactor and vertical flow. The use of a cold-walled reactor is a significant departure from conventional HVPE systems. Conventionally, HVPE utilizes a so-called "hot walled" reactor, using a tube furnace, where the growth chamber walls are at higher temperature or at least the same temperature as the substrate. One reason for this is the necessity of keeping the Ga source at 850° C. while the substrate is at a different temperature. For example, a GaAs substrate would be kept at approximately 600° C., while sapphire, a typical substrate used for GaN, would be kept at approximately 1050° C. Thermodynamically the HVPE reaction driving force decreases with increasing temperature; a lower substrate temperature compared to chamber walls is desirable to inhibit wall deposits.

The conceptually new design features a "cold-walled" reactor for the HVPE growth chamber. In embodiments of the present invention, the vertical flow design in the HVPE system can be configured to produce negligible reactive gas interaction on the walls before impinging on the substrate. This reduces wall deposition and particulate generation and improves process yield for long and thick growths. Additionally, since the walls are relatively cool, stainless steel can be used for the reactor body, in place of the traditional fused silica construction. The stainless steel body obviates the O-rings required by a traditional design. This provides a robust, leak-resistant chamber.

A third component of certain embodiments of the invention is a gas isolation/diffuser plate. A gas diffuser is used for three purposes. First, it insures that carrier gas is evenly distributed over the substrate region and the flow of gas is as laminar as possible. Second, the gas diffuser shields the metal upper flange of the growth chamber from direct (radiative) heating from the substrate. Third, the gas diffuser allows the separation of reactant gas species—the reactant gases can be directed to impinge on the substrate from different radial positions thereby isolating different reactant gas species from each other.

A fourth component of certain embodiments of the invention is low pressure operation. The growth system can be run at sub-atmospheric pressure, in the range of 50-400 torr. Sub-atmospheric operation has significant advantages for certain rotating substrate/vertical flow systems, especially with respect to a reduction in buoyancy forces at the substrate boundary layer interface. In one embodiment, a vacuum pump with a vacuum controller and throttle valve can be used to maintain the desired operating pressure. In another embodiment, a particulate-arresting foreline trap may be placed between the exhaust of the reactor and the inlet for the pump for the purpose of filtering particles and other reaction byproducts to prolong the longevity of the pump. Exhaust gas from the pump may be scrubbed of toxic arsenic components before being released into an exhaust system.

A fifth component of certain embodiments of the invention is a wafer loading mechanism via a vacuum pumped load lock system. In an embodiment of the invention, a platen with a substrate may be loaded onto a manipulator arm (e.g., a loading fork) in the load lock and the load lock may be pumped down using the system's vacuum pump, using a specially designed vacuum manifold system. Once the load lock is at vacuum, the gate valve may be opened and the platen may be loaded on to the susceptor; in this way the possibility of system contamination by air or moisture may be minimized.

These and other objects, advantages and features of the invention will be set forth in part in the description which follows and in part will become apparent to those having ordinary skill in the art upon examination of the following, or may be learned from practice of the invention. The advantages of the invention may be realized and attained as particularly pointed out in the appended claims.

It is within this context that embodiments of the present invention arise.

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

Figure 1:
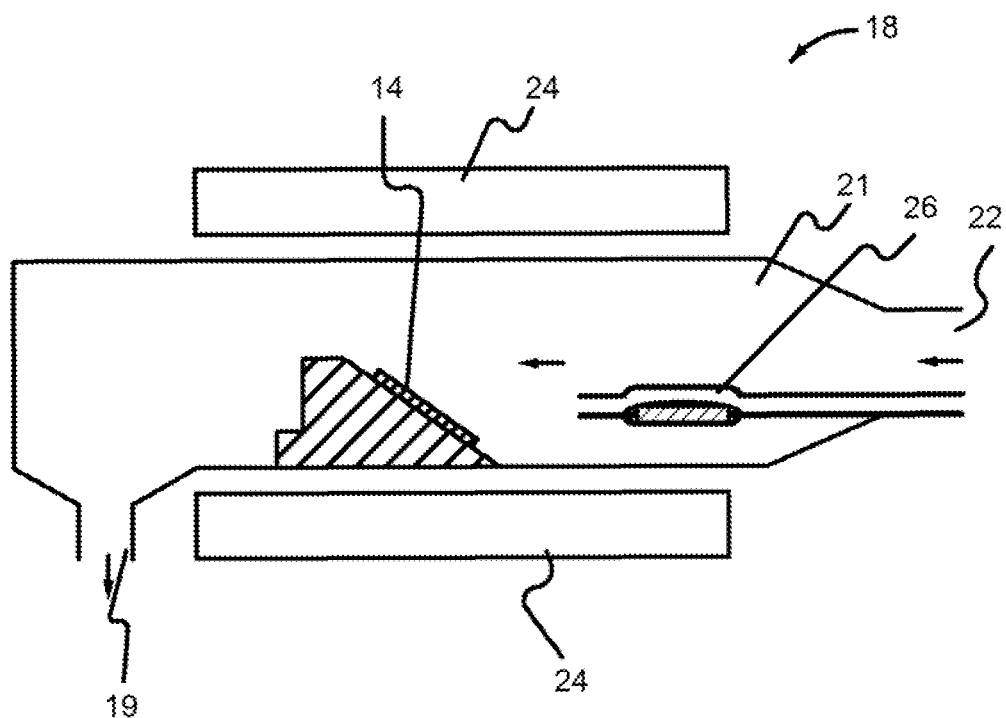
FIG. 1 is a schematic diagram representing a hydride vapor phase epitaxy (HVPE) system of the prior art.

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

A modern design hydride vapor-phase eptiaxy (HVPE) deposition system capable of producing deposition on a commercial scale is described below. The design addresses and remedies problems with the HVPE technique that have limited its commercial implementation. The design of this HVPE deposition system is especially applicable to growth of III-V materials such as Ga(In,Al)As, Ga(In,Al)N, Ga(In,Al)P, and Ga(In,Al)Sb. The system design includes several aspects. A first aspect is a metal source that is external to the reactor and that incorporates a design that insures uniform metal reactant in the gas stream. Such a design will allow loading of the metal source independent of opening the system in a way that is similar to an organometallic MOVPE source. Removing the metal source from the reactor chamber will allow independent temperature control. A second aspect is a vertical growth system design. A third aspect is a diffuser plate that both supplies a uniform carrier gas and can separate flows of different reactant species, limiting their chance of reacting before impinging on the deposition substrate. A fourth aspect is an effectively infinite stagnation flow design so that the lateral reactor walls are not involved in the reaction kinetics. Therefore, the walls do not need to be heated at or above the growth temperature as in typical HVPE. Thus, the reactor can be made of metal, a departure from the more conventional quartz HVPE system. Furthermore, the walls can be cooled. Because of the vertical geometry an exhaust pump is nearly essential to limit recirculation. Since the reactor can be fabricated of metal, a load-lock loading system can be employed.

According to an embodiment of the invention, a hydride vapor-phase deposition system may include a reactant source chamber, a growth chamber coupled to the reactant source chamber, and a susceptor disposed in the growth chamber, with a substrate disposed upon the susceptor. Additional reactant and non-reactant gases may enter the growth chamber without entering the reactant source chamber. The reactant source chamber can be configured to create a reactant gas species (R(M)) through a chemical reaction between a solid or liquid reactant M and a different precursor gas (PG(M)). The reactant gas species R(M) is chemically unstable at or near room temperature. The reactant source chamber can operate at a temperature T(M) that is significantly above room temperature. Additionally, reactant species enter the growth chamber directly. This can be done in conjunction with the diffuser plate and additional non-reactant gas flow(s) to separate and isolate reactant species until they impinge upon the substrate. Further, non-reactant gas flows can be used to isolate reactant species from interacting with the growth chamber walls, and to stabilize the flow patterns within the growth chamber. The susceptor can be configured to operate at a temperature T(S); the substrate disposed upon the susceptor is directly heated by the susceptor—the actual substrate temperature may differ from T(S) but it will always be tightly correlated to the value of T(S). The growth chamber can have walls configured to operate at a temperature T(C) such that T(M), T(S) are always greater than T(C).

To illustrate the difference between embodiments of the present invention and conventional HVPE systems, FIG. 1 schematically represents a HVPE system 18 according to the prior art. Briefly, system 18 includes a growth chamber 21 also sometimes referred to as a reactor. The system 18 may be contained entirely within a heat source, e.g., a furnace 24. By way of example, and not by way of limitation, the growth chamber 21 may be more or less tube-shaped with an inlet 22, and an outlet 19. A reactant source chamber 26 sometimes referred to as a reaction assembly can be configured to produce a reactant gas used in a growth reaction that takes place in the growth chamber 21.

The reactant source chamber 26 makes the system 18 different from a metal-organic chemical vapor deposition (MOCVD) chamber. The reactant source chamber 26 is used to create a reactant, as opposed to dispensing one from a bottle. This is particularly important if the reactant that is created is unstable and cannot be stored at or near room temperature; in particular the reactant species might require temperatures above room temperature for chemical stability.

Epitaxial deposition on a heated substrate 14 proceeds by the vapor-phase reaction of source or reactant gases, which are introduced into reactor 21. For example a reactant gas, such as gallium chloride, indium chloride, or aluminum chloride, may be projected towards substrate 14 via the reactant source chamber 26. Another reactant, such as ammonia may be introduced into growth chamber 21 through the reactor inlet 22. Reactant gas, e.g. GaCl, may be formed in the reaction assembly 26 by passing a precursor gas (e.g., HCl) over liquid metal (e.g., gallium) at elevated temperatures. The direction of gas flow is indicated by the arrows. reactant gases (e.g., GaCl, InCl, AlCl) react with ammonia within growth tube 21 to form the respective nitride, GaN, InN, or AlN, which is deposited on substrate 14. The furnace 24 is used to maintain the growth chamber walls at a higher temperature or at least the same temperature as the substrate 14.

Figure 2:
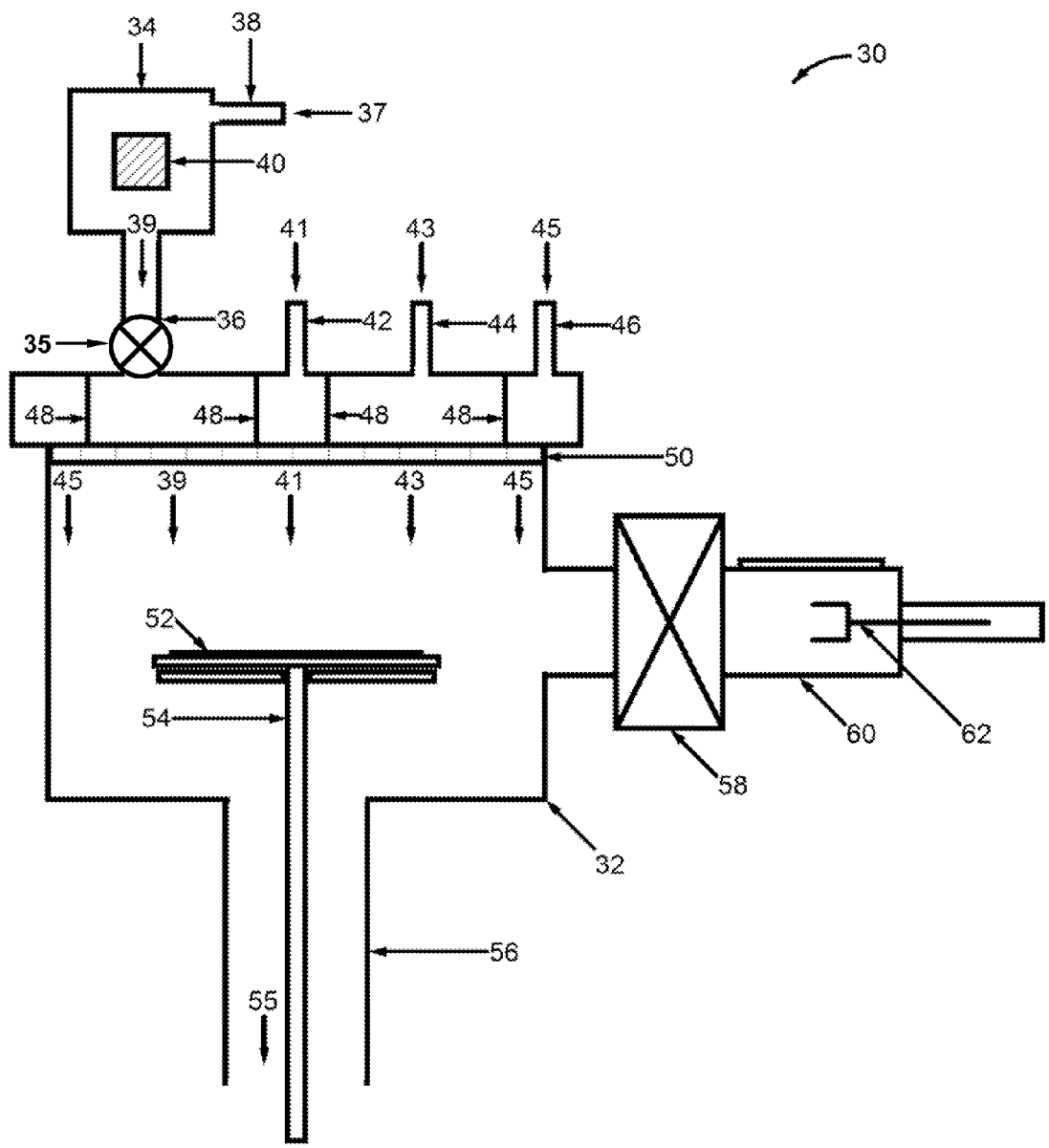
FIG. 2 is a schematic diagram representing an HVPE system according to an embodiment of the invention.

FIG. 2 schematically represents an HVPE system 30 according to an embodiment of the invention. The system 30 includes a growth chamber 32 and an external reactant delivery chamber 34 coupled to growth chamber 32 via a reactant delivery tube 36. Precursor gas 37 (e.g., HCl) is input into a reactant source chamber 34 via reactant source chamber inlet 38, whereupon it reacts with metal source 40 to create the reactant gas 39 (e.g., GaCl). There are many different gases that can be used as the precursor gas 37. By way of example, and not by way of limitation, the precursor gas 37 can be a halide or halide compound. Examples of suitable halides or halide compounds include, but are not limited to HF, HBr, HI, HCl, $F_2$, $Br_2$, $I_2$, or $Cl_2$.

Reactant gas 39 is delivered to the growth chamber 32 via reactant delivery tube 36 which is maintained at an elevated temperature thereby providing a zone of elevated temperature between the reactant source chamber 34 and the growth chamber 32 configured to inhibit decomposition of the reactant gas. Inert carrier gas 41 can be introduced into the growth chamber 32 via a carrier gas input 42, a second reactant gas 43, e.g., ammonia (or arsine, phosphine, etc.) can be introduced into the growth chamber 32 via reactant input 44, and wall isolation flow carrier gas 45 can be introduced into growth chamber 32 via a wall isolation gas input 46. As noted above, this feature can keep the walls of the growth chamber 32 from becoming involved in reaction kinetics. This allows the walls of the growth chamber to be maintained at relatively low temperature compared to the temperature of the reactant source chamber 34. Consequently, the growth chamber 32 can be made of metal such as stainless steel. Further, the elimination of wall deposits that may have a tendency to re-evaporate or flake off during the growth process can stabilize the growth dynamics and increase crystal growth quality and purity.

There are a number of different possible gases that can be used as the second reactant gas 43. By way of example, and not by way of limitation, the second reactant gas 43 can be a hydride of the form $X_n H_m$, where X is any element of the periodic table, and n and m are integers greater than or equal to 1. Examples of such hydrides include, but are not limited to $NH_3$, $AsH_3$, $PH_3$, $SbH_3$, or $BH_3$.

Other gases or reactants can be introduced into the growth chamber 32 through suitably configured inlets. Examples of such other gases or reactants include, but are not limited to dopants, metal-organic compounds. Furthermore, although a single reactant source chamber is shown in FIG. 2, the scope of embodiments of the present invention include systems in which two or more reactant source chambers are coupled to a growth chamber. Multiple reactant source chambers can be used to generate introduce different reactants or the same reactant.

The reactant source chamber 34 can be configured to be serviced and maintained without entering, opening or otherwise exposing the growth chamber 32 to air. By way of example and not by way of limitation, the reactant source chamber may be connected to the growth chamber via a valve 35 that can be closed to isolate the growth chamber 32 from the reactant source chamber 34 when the reactant source chamber is opened for service or maintenance. Alternatively, the growth chamber 32 may be coupled to a source of an inert purge gas (e.g., nitrogen or argon). The purge gas can be isolated selectively flowed through the growth chamber 32 during periods when the reactant source chamber 34 is open for service or maintenance. The flow of purge gas can prevent exposure of the growth chamber 32 to air. Alternatively, some combination of a valve and purge gas flow can be used to isolate the growth chamber 32 from exposure to air when the reactant source chamber 34 is opened for service and/or maintenance.

A diffuser plate having a system of internal baffles 48 serves to isolate the flows of these various gases from each other to prevent mixing and to allow each particular gas to stream forth through a perforated disk 50 in a laminar and controlled manner prior to impingement onto substrate 52. Substrate 52 can be situated on a rotating platform (also referred to as a susceptor) with an integrated heater, 54. Rotation of the platform 54 and substrate 52 serves to provide mixing for the gas streams as they impinge onto the hot substrate 52 allowing for the deposition reaction to occur uniformly over the surface. Exhaust gases 55 exit the growth chamber 32 via chamber outlet 56.

Substrate 52 can be loaded to and unloaded from growth chamber 32 via a separately pumped load lock 60, using a loading arm assembly 62. Load lock 60 is isolated from growth chamber 32 via gate valve 58, which is opened only for loading or unloading substrate 52 from rotating platform 54.

Separate heaters and/or cooling units (not shown) for the growth chamber 32, reactant source chamber 34 and platform 54 can maintain the walls of the growth chamber 32 at a temperature T(C), the reactant source chamber 34 at a temperature T(M) and the substrate 52 or platform 54 at a temperature T(S) such that T(M) and T(S) are always greater than T(C). By way of example, the heaters can be resistive heating elements. Temperature sensors (e.g., thermocouples) can be coupled to the growth chamber 32 reactant source chamber 34 and platform 54 to monitor their respective temperatures. These temperature sensors can be coupled in feedback loops to one or more temperature control units that are coupled to the heating and/or cooling units to maintain desired values for the temperatures T(S), T(M) and T(C).

Figure 3:
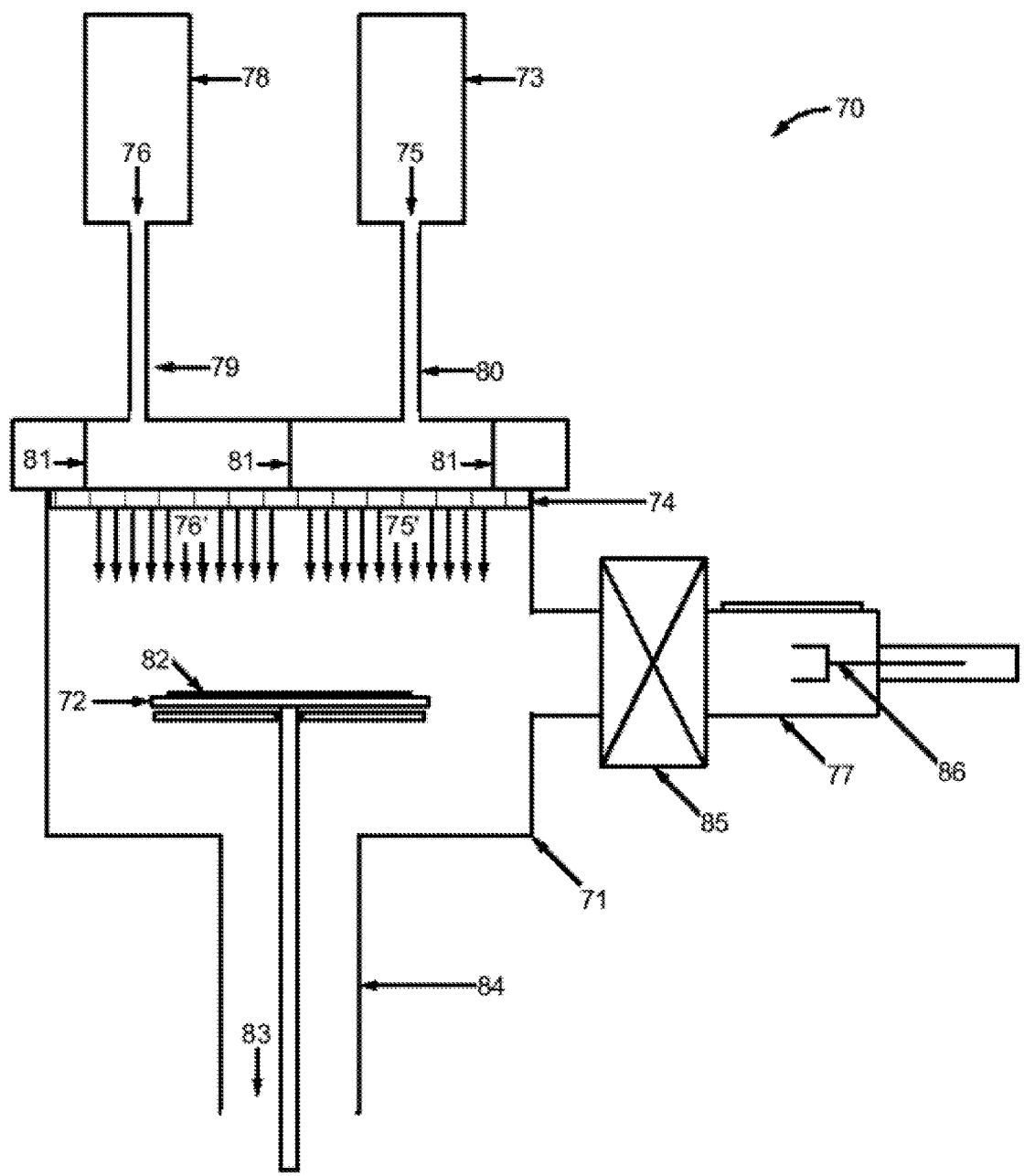
FIG. 3 is a cut-away schematic diagram representing an HVPE system according to an alternative embodiment of the invention.

According to an alternative embodiment illustrated in FIG. 3, a hydride vapor-phase deposition system 70 may include a growth chamber 71 containing a susceptor 72, a hydride reactant gas source 73 connected to the growth chamber, and an upstream diffuser plate 74 configured to separate a flow of reactant gas species 75 from the hydride reactant gas source 73 from one or more other reactant gases species 76 and further configured to provide corresponding desired gas flow distributions 75', 76' toward the susceptor 72. The system 70 may further include a load-locking system 77 attached to the growth chamber 71 that isolates the environment of the growth chamber 71 from an external environment while allowing the passing through of substrate materials.

Specifically, as depicted in FIG. 3, hydride reactant gas source 73 supplies hydride reactant gas 75 to growth chamber 71 via hydride reactant gas inlet 80. Likewise, reactant gas source 78 supplies one or more reactant gas species 76 to growth chamber 71 via reactant gas inlet 79. The reactant gas species 75 and 76 pass through the diffuser plate 74 whereupon the flow distributions 75' and 76' are channeled and made uniform and laminar before impinging on a substrate 82, arranged onto susceptor 72. Gas baffles 81, upstream of the diffuser plate 74, serve to prevent the reactant gases 75 and 76 from mixing prior to their egress from the diffuser plate 74 as gas flow distributions 75' and 76'. Exhaust gas 83, containing a mixture of the gases 75 and 76 and their reaction byproducts, is carried out of growth chamber 71 via an exhaust outlet 84.

The substrate 82 can be placed on and removed from the susceptor 72 using a manipulator arm 86, attached to a load lock 77. The load lock 77 can be isolated from growth chamber 71 by gate valve 85, which can be kept sealed except during loading or unloading substrate 82 from susceptor 72.

There are a number of different configurations for the diffuser plate in the systems shown in FIG. 2 and/or FIG. 3. By way of example, and not by way of limitation, the diffuser plate used in the system of FIG. 2 and/or FIG. 3 may be configured as illustrated in FIGS. 4A-4F.

Figure 4A:
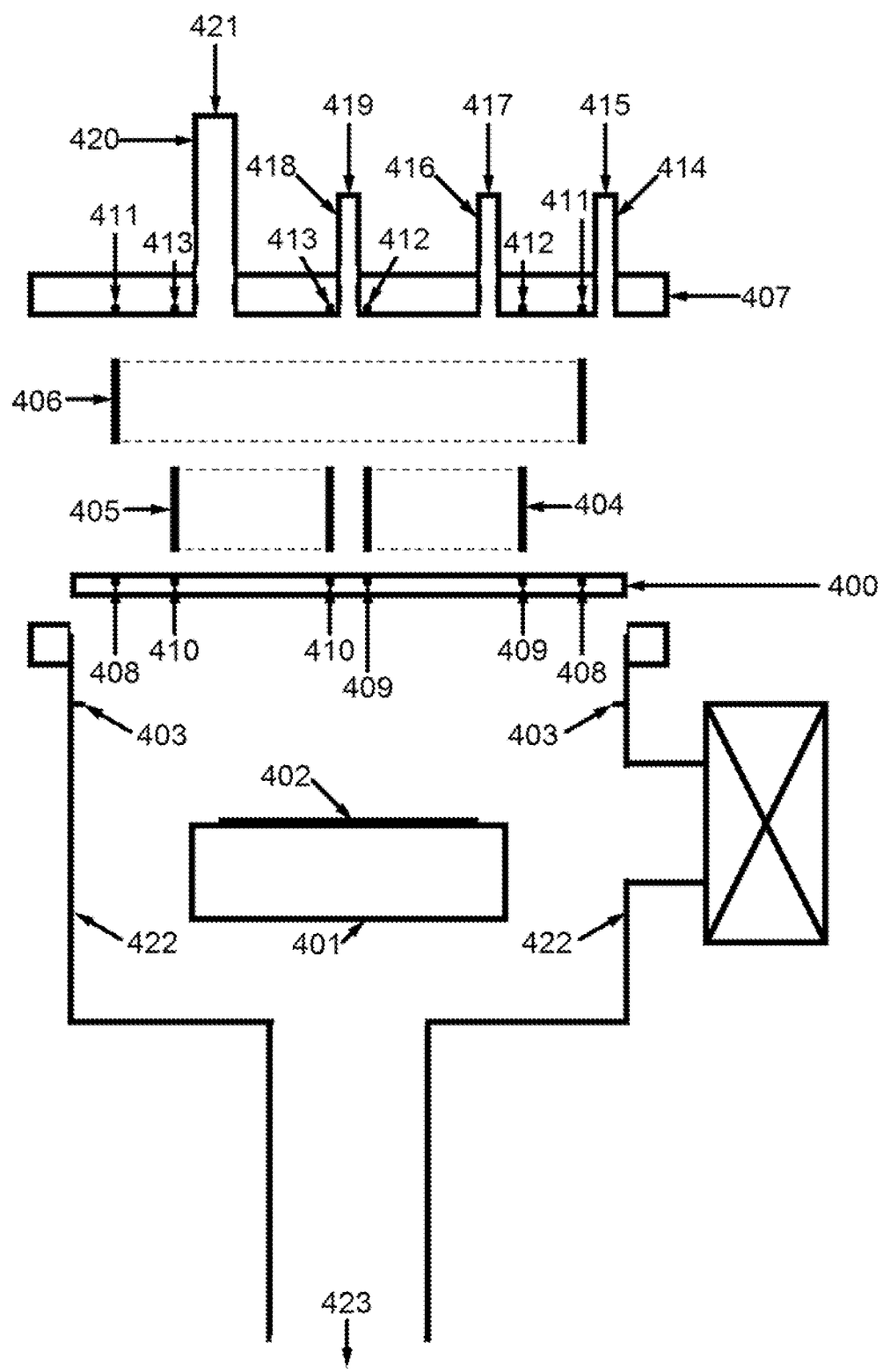
FIG. 4A is an exploded cross-sectional view of a growth chamber assembly including gas isolation/diffuser plates, according to an embodiment of the invention.

Specifically, as depicted in assembly diagram FIG. 4A, perforated diffuser plate 400 is held above susceptor 401 and substrate 402 in a growth chamber. In this example, an annular lip 403 on a wall 422 of the growth chamber can act as a stop and rest for the diffuser plate 400, although other means of suspension such as screws or fasteners may be used to the same effect. The general shape of the diffuser plate 400 can be configured to conform to an internal cross-section of the growth chamber. By way of example, if the internal cross-section of the chamber is cylindrical, the diffuser plate 400 can be a perforated disk. In FIGS. 4A-4F, the perforations in the diffuser plate 400 are not shown for reasons of visual clarity, but are assumed to be present nonetheless. The perforations can be configured to ensure a regular and/or laminar flow toward substrate 402. Holes in the diffuser plate 400 can act as capillaries, converting the turbulent flow enclosed within the spaces between the diffuser plate 400 and flange 407 to laminar or laminar-like flow as it exits disk 400. The optimal density and diameter of the holes in the diffuser plate 400 can be determined from the desired flow rates and kinematic viscosities of the process gases in use; generally it is desirable to maintain a Reynolds number below 2300 to ensure laminar or laminar-like flow. Additionally, it is desirable for the aspect ratio of the holes (e.g., the ratio of the thickness of diffuser plate 400 to the hole diameter) to be greater than 1 to allow the capillaries to impart their effect onto the gas flow.

Gas baffles 404, 405, and 406 are sandwiched between diffuser plate 400 and growth chamber upper flange 407. Each baffle is shaped to contain a flow of a different gas within a specified volume prior to exiting the diffuser plate. This prevents the gases from mixing before entering the growth chamber. In the example depicted in FIGS. 4A-4F, a first baffle 404 serves to contain a first reactant gas 417 within its volume prior to its egress from the diffuser plate 400. The first baffle 404 may be set into a groove 409 carved into disk 400, and matching groove 412 carved into an upper flange 407 that serves as a lid for the growth chamber. The grooves 409 and 412 can provide a better gas seal between the region within the first baffle 404 and that external to it. Likewise, a second baffle 405 can serve to contain a second reactant gas 421 within its volume, resting within grooves 410 and 413 in diffuser plate 400 and flange 407 respectively. An annular third baffle 406 that surrounds both the first and second baffles serves to isolate gas flow in a region adjacent to the growth chamber walls 422 from a center of the growth chamber, directing a wall isolation gas 415 along the growth chamber walls 422, limiting wall deposition reactions. As with the other baffles, annular baffle 406 can be set into groove 408 in disk 400, and a groove 411 in flange 407, to further block incidental gas flow between adjacent regions.

Figure 4B:
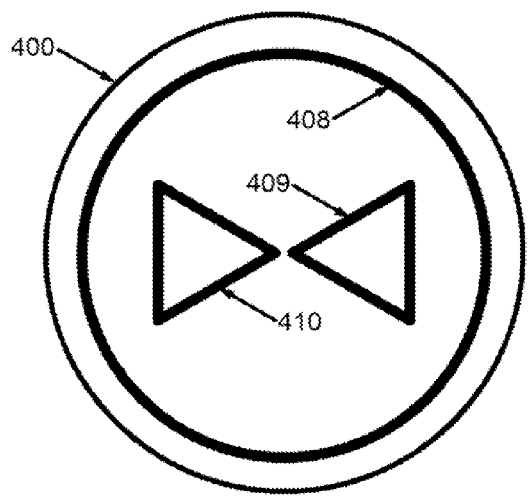
FIG. 4B is a topside view of the diffuser plate from the assembly in FIG. 4A.

FIG. 4B shows a topside view of the diffuser plate 400, indicating the location of annular groove 408 (for baffle 406), and grooves 409 and 410, for baffles 404 and 405 respectively. The perforations are not shown for clarity, but are assumed to be present.

Figure 4C:
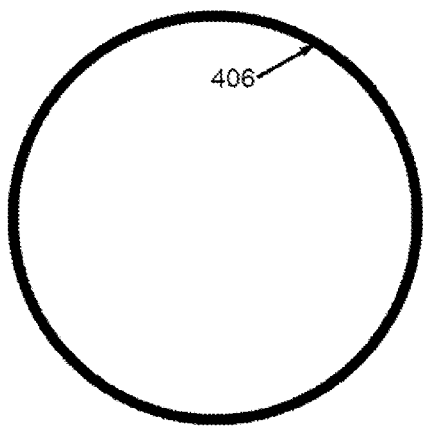
FIGS. 4C-4E are plan views of baffles from the assembly in FIG. 4A.

FIG. 4C shows a plan view of the annular third baffle 406, which is effectively a squat annular cylinder.

Figure 4D:
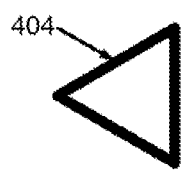

FIG. 4D shows a plan view of the first baffle 404. While the first baffle 404 is shown as triangular in shape, it may be of any appropriate geometry to allow for uniform reactant flow through disk 400 onto substrate 402.

Figure 4E:
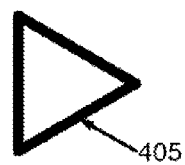

FIG. 4E shows a plan view of the second baffle 405. Baffle 405 is shown as triangular in shape, but it may be of any appropriate geometry to allow for uniform reactant flow through disk 400 onto substrate 402.

Figure 4F:
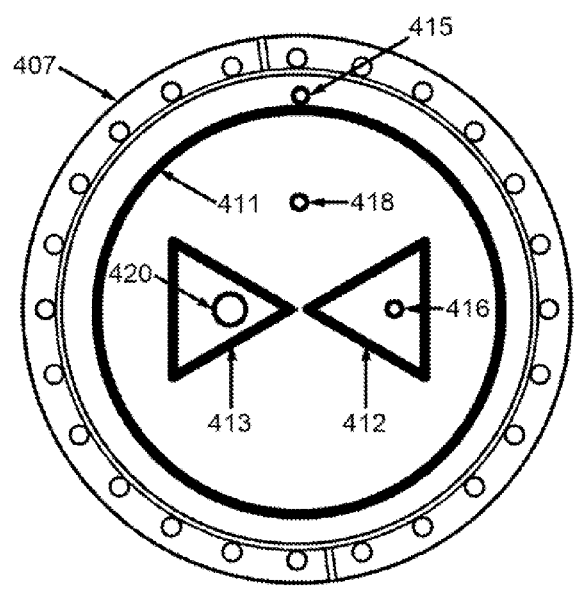
FIG. 4F is a bottom-side view of the underside of a growth chamber flange from the assembly of FIG. 4A.

FIG. 4F shows a bottom-side view of the underside of growth chamber flange 407. Annular groove 411 is present to fit annular baffle 406. Grooves 412 and 413 are present to fit baffles 404 and 405 respectively. A first reactant gas inlet 416 (for reactant gas 417) is present within the area enclosed by baffle 404; likewise a second reactant gas inlet 420 (for the second reactant gas 421) is present within the area enclosed by baffle 405. A process bulk carrier gas inlet 418 allows a carrier gas 419 into the volume not enclosed by baffles 404, 405, and 406, whereupon it flows through diffuser plate 400 toward substrate 402. Wall isolation gas 415 is fed into the annular space between the growth chamber walls 422 and the annular third baffle 406, whereupon it flows through the diffuser plate 400 toward growth chamber exhaust 423.

The foregoing embodiments are merely examples and are not to be construed as limiting the present invention. The present teaching may be applied to other types of apparatuses and methods. The description of the present invention is intended to be illustrative, and not to limit the scope of the appended claims. Many alternatives, modifications, and variations will be apparent to those skilled in the art.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A hydride vapor-phase deposition system comprising:
   a. a reactant source chamber configured to create a first reactant gas (R(M)) through a chemical reaction between a solid or liquid precursor M and a different precursor gas (PG(M)), wherein the reactant source chamber operates at a temperature T(M) which is significantly above room temperature, and where the first reactant gas R(M) is chemically unstable at or near room temperature;
   b. a susceptor configured to receive a substrate and maintain the substrate at or near the susceptor temperature T(S);
   c. and a growth chamber coupled to the reactant source chamber, wherein the growth chamber contains the susceptor, wherein the growth chamber includes growth chamber walls configured to operate at a temperature T(C) such that T(M), T(S) are always greater than T(C).

2. The deposition system of claim 1, further comprising an internal heating source configured to control T(S), and an external heating or cooling source configured to control T(C) independent of T(S).

3. The deposition system of claim 1 wherein the reactant source chamber is external to the growth chamber, physically separated from the growth chamber, and coupled to the growth chamber by an orifice having a diameter substantially smaller than a diameter of the growth chamber.

4. The deposition system of claim 1 wherein the reactant source chamber temperature T(M) is controlled and maintained independently of the substrate temperature T(S).

5. The hydride vapor-phase deposition system of claim 1 wherein the growth chamber is configured to contain a separate gas flow isolating portions or the entirety of the growth chamber walls from the first reactant gas.

6. The deposition system of claim 1 wherein the reactant source chamber is configured to be serviced and maintained without entering or opening the growth chamber to air.

7. The deposition system of claim 1 wherein the precursor M includes one or more elements from column II, III or IV of the periodic table.

8. The deposition system of claim 1 wherein the precursor M includes a metal.

9. The deposition system of claim 1 wherein the substrate includes sapphire, aluminum oxide, silicon carbide, lithium aluminate, gallium arsenide, indium phosphide, silicon, germanium, or lithium gallate, and/or related materials and compounds.

10. The deposition system of claim 1 wherein the precursor gas (PG(M)) reacts with the precursor M to form the first reactant gas (R(M)).

11. The deposition system of claim 1 wherein the precursor gas (PG(M)) is a halide or halide compound.

12. The deposition system of claim 1 wherein the precursor gas (PG(M)) is HF, HBr, HI, HCl, $F_2$, $Br_2$, $I_2$, or $Cl_2$.

13. The hydride vapor-phase deposition system of claim 1 wherein the system is configured to limit an interaction between a reactant gas stream containing the first reactant gas and the growth chamber walls upstream from the substrate.

14. The hydride vapor-phase deposition system of claim 1 wherein the growth chamber is configured to receive a second reactant gas, wherein the second reactant gas is a hydride of the form $X_n H_m$, where X is any element of the periodic table, and n and m are integers greater than or equal to 1.

15. The hydride vapor-phase deposition system of claim 14 wherein the second reactant gas is $NH_3$, $AsH_3$, $PH_3$, $SbH_3$, or $BH_3$.

16. The hydride vapor-phase deposition system of claim 14 wherein the second reactant gas does not enter or pass through the reactant source chamber.

17. The hydride vapor-phase deposition system of claim 14 wherein the first reactant gas R(M) and the second reactant gas enter the growth chamber through separate orifices.

18. The hydride vapor-phase deposition system of claim 14 wherein the growth chamber is configured to contain a separate carrier gas flow isolating portions or the entirety of the growth chamber walls from the first and/or second reactant gases.

19. The hydride vapor-phase deposition system of claim 14 further comprising a diffuser plate, wherein said diffuser plate is configured to spatially separate flows of the first and second reactant gas species to prevent them from mixing as they flow toward the susceptor.

20. The hydride vapor-phase deposition system of claim 19 in which the diffuser plate is configured to provide a desired spatial distribution of a flow of a carrier gas.

21. The hydride vapor-phase deposition system of claim 19 wherein the diffuser plate is configured to provide a carrier gas flow distribution that isolates the growth chamber walls from the first and second reactant gases.

22. The hydride vapor-phase deposition system of claim 21 wherein the growth chamber is made of a metal.

23. The hydride vapor-phase deposition system of claim 14 further comprising a carrier gas injector configured to separately inject a flow of carrier gas to aid in the spatial separation of the first and second reactant gases.

24. The hydride vapor-phase deposition system of claim 1 wherein the growth chamber is configured to operate at an operating pressure between 1 torr and 1500 torr.

25. A hydride vapor-phase deposition system comprising:
 a growth chamber containing a susceptor;
 a reactant source chamber;
 a hydride reactant gas source connected to the growth chamber;
 a diffuser plate configured to separate a flow of reactant gas species from the hydride reactant gas source from one or more other reactant gas species and further configured to provide a desired gas flow distribution toward the susceptor; and
 a load-lock loading system attached to the growth chamber that isolates the environment of the growth chamber from the external environment while allowing the passing-through of substrate materials.

26. The hydride vapor-phase deposition system of claim 25 in which a zone of elevated temperature is provided between the reactant source chamber and the growth chamber, wherein the zone of elevated temperature is configured to inhibit decomposition of one or more of the reactant gas species.

27. The hydride vapor-phase deposition system of claim 25 in which the substrate heater, growth chamber walls and diffuser plate are shielded or exposed to maintain a target temperature regime in a transition region between the reactant source chamber and the growth chamber, and/or the growth chamber.

28. The hydride vapor-phase deposition system of claim 25, further comprising an external reactant source chamber configured to permit consumable precursor materials to be added to the external reactant source chamber without the removal of the reactant source chamber from the growth chamber.

29. The hydride vapor-phase deposition system of claim 28 wherein the external reactant source chamber contains metallic precursor material.

30. The hydride vapor-phase deposition system of claim 29 in which the metallic precursor material includes one or more metals from the group of chromium, manganese, iron, cobalt, nickel, copper, zinc, cadmium, mercury, gallium, indium, aluminum, carbon, silicon, germanium, tin, or lead.

31. A deposition method comprising:
 a. creating a first reactant gas (R(M)) in a reactant source chamber through a chemical reaction between a solid or liquid precursor M and a different precursor gas (PG(M)), wherein the reactant source chamber operates at a temperature T(M) which is significantly above room temperature, and where the first reactant gas R(M) is chemically unstable at or near room temperature;
 b. delivering the first reactant gas to a growth chamber coupled to the reactant source chamber, wherein the growth chamber contains a susceptor;
 c. maintaining a substrate on the susceptor at or near a susceptor temperature T(S);
 d. operating walls of the growth chamber at a temperature T(C) such that T(M), T(S) are always greater than T(C).

32. The method of claim 31 wherein the precursor M includes one or more elements from column II, III or IV of the periodic table.

33. The method of claim 31 wherein the precursor M includes a metal.

34. The method of claim 31 wherein the substrate includes sapphire, aluminum oxide, silicon carbide, lithium aluminate, gallium arsenide, indium phosphide, silicon, germanium, or lithium gallate, and/or related materials and compounds.

35. The method of claim 31 wherein the precursor gas (PG(M)) reacts with the precursor M to form the first reactant gas (R(M)).

36. The method of claim 31 wherein the precursor gas (PG(M)) is a halide or halide compound.

37. The method of claim 31 wherein the precursor gas (PG(M)) is HF, HBr, HI, HCl, $F_2$, $Br_2$, $I_2$, or $Cl_2$.

38. The method of claim 31 further comprising limiting an interaction between a reactant gas stream containing the first reactant gas and the growth chamber walls upstream from the substrate.

39. The method of claim 31 further comprising delivering a second reactant gas to the growth chamber, wherein the second reactant gas is a hydride of the form $X_nH_m$, where X is any element of the periodic table, and n and m are integers greater than or equal to 1.

40. The method of claim 39 wherein the second reactant gas is $NH_3$, $AsH_3$, $PH_3$, $SbH_3$, $BH_3$.

41. The method of claim 39 wherein the second reactant gas does not enter or pass through the reactant source chamber.

42. The method of claim 39 wherein the first reactant gas R(M) and the second reactant gas enter the growth chamber through separate orifices.

43. The method of claim 39 further comprising flowing a carrier gas flow isolating portions or the entirety of the chamber walls from the first and/or second reactant gases.

44. The method of claim 39 further spatially separating flows of the first and second reactant gas species to prevent them from mixing as they flow toward the susceptor.

45. The method of claim 44 further comprising providing a carrier gas flow distribution that isolates the growth chamber walls from the first and second reactant gases.

* * * * *